United States Patent [19]

Steigerwald et al.

[11] 4,013,261
[45] Mar. 22, 1977

[54] DEVICE FOR PRODUCING WORK PIECES PERFORATED BY MEANS OF ELECTRON BEAMS

[75] Inventors: Karl Heinz Steigerwald, Starnberg; Dietor König, Munich-Neuaubing; Wilhelm Scheffels, Germering; Klaus Glieneck, Munich, all, Germany

[73] Assignee: Steigerwald Strahltechnik GmbH, Munich, Germany

[22] Filed: Oct. 16, 1975

[21] Appl. No.: 622,947

[30] Foreign Application Priority Data

Oct. 16, 1974 Germany .................... 2449265

[52] U.S. Cl. .................... 250/453; 219/121 EB; 250/492 B
[51] Int. Cl.$^2$ .................... H01J 37/00
[58] Field of Search .......... 250/492 B, 492 A, 398, 250/400, 453; 219/121 EB

[56] References Cited

UNITED STATES PATENTS 3,206,336  9/1965  Hora .................... 250/492 A

FOREIGN PATENTS OR APPLICATIONS 714,613  9/1954  United Kingdom ............ 250/492 B

*Primary Examiner*—Craig E. Church
*Attorney, Agent, or Firm*—Andrus, Sceales, Starke & Sawall

[57] ABSTRACT

A device for producing work-pieces, in particular foil blanks perforated by means of electron beams, for example for shoe upper parts, with an electron beam work chamber which can be evacuated, input and output appliances placed outside the work chamber for the input of unperforated work-pieces or the output of perforated work-pieces, and a transport appliance with a transport track extending between the input and output appliance and the work chamber across air locks for the controlled transport of work-piece carriers, to which the work-pieces can be applied in predetermined positions, wherein in a given work area within the work chamber a work-piece carrier which forms an element of a series of work-piece carriers lying in the transport track can be moved in at least one work track lying outside the positions of the adjacent work-pieces in the series, relative to a beam source that the work-piece can be perforated at several points by means of the beam source.

30 Claims, 7 Drawing Figures

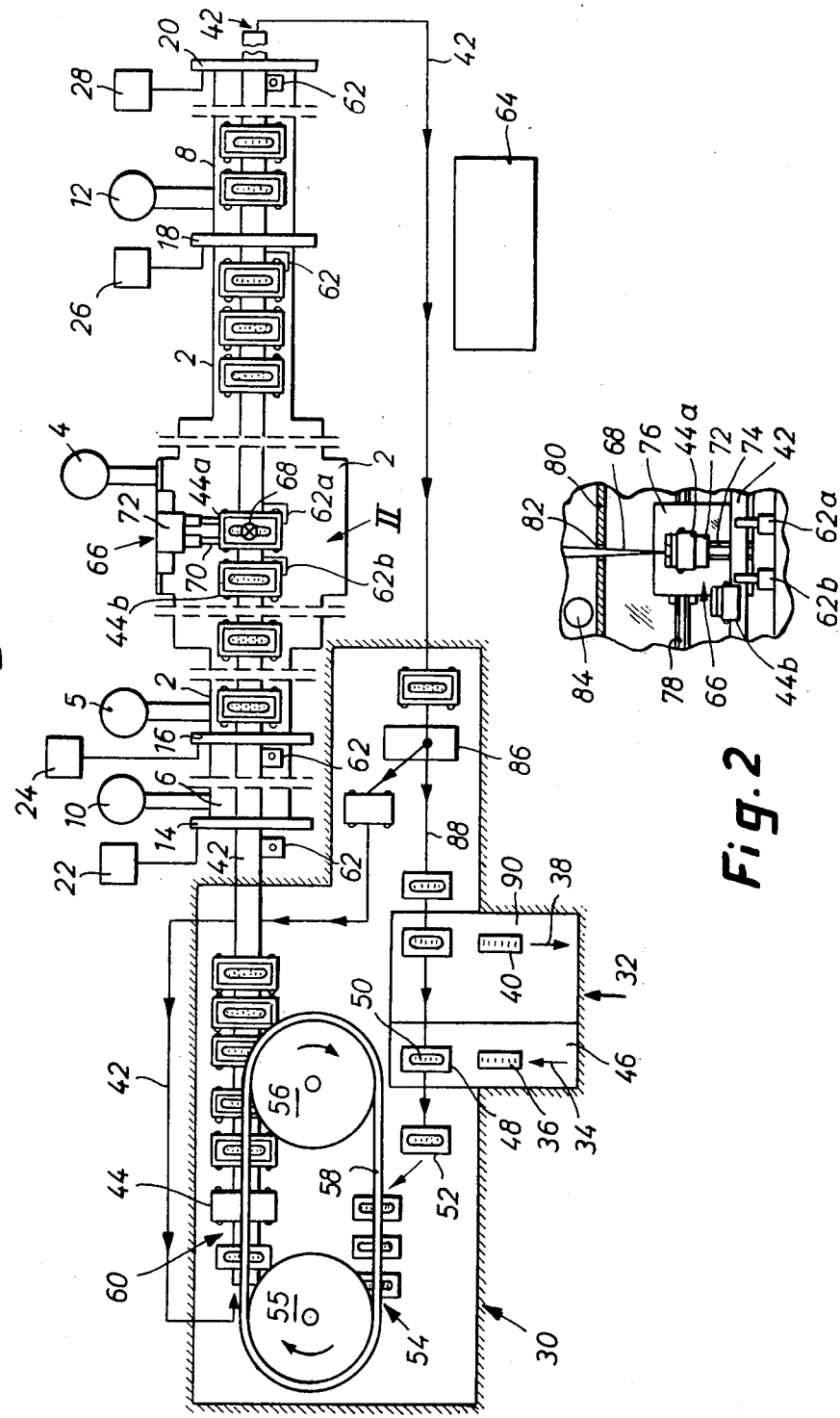

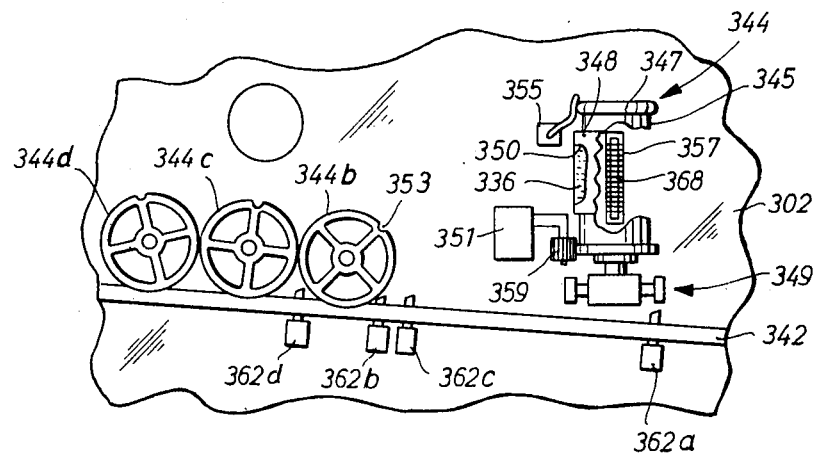
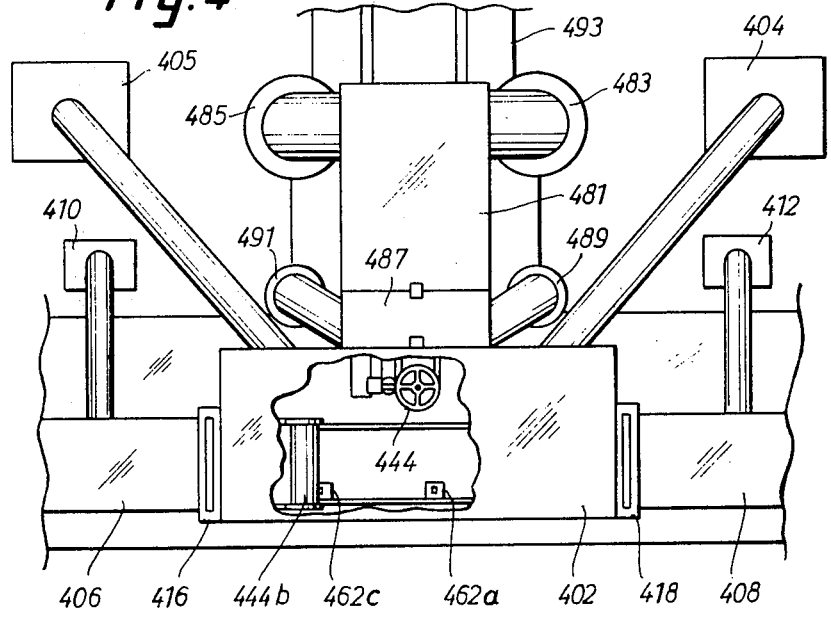

DEVICE FOR PRODUCING WORK PIECES PERFORATED BY MEANS OF ELECTRON BEAMS

BACKGROUND OF THE INVENTION

The invention relates to a device for producing work pieces perforated by means of electron beams, in particular foil-blanks, as for shoe upper-parts, with an electron beam working chamber, which can be evacuated, situated outside the work chamber input and output appliances for the input of unperforated work pieces or the output of perforated work pieces, and a transport appliance with a transport track stretching between the input and output appliances and the work chamber over air locks for controlled transport of work-piece carriers, to which the workpieces are applied in predetermined positions.

It is well known that it is possible to give workpieces, especially synthetic foils, a required perviousness with respect to gases in a specially advantageous way by perforation with electron beams or other energy beams; in this way, very fine and if required even practically invisible perforation bores can be produced very quickly and with a large surface density, whereby these perforation bores, even with work-pieces made of synthetic materials show only a slight tendency to close again under the influence of plastic deformation, because the walls of the perforation bores are set in a crust-like formation as a result of the thermic effect of the electron beam. It has already been suggested in the production of foil blanks not to carry out such perforation work on continuous foil tracks but on individual blanks, especially for shoe upper parts; this offers, among other things, the advantage, that possible impression and moulding operations taking place under the influence of heat on the individual blanks can be carried out before perforation, so that the danger that the perforation bores are closed again by subsequent work processes under the influence of heat is excluded. It has also been suggested that such blanks should be guided either continuously or by means of continuously working transport appliances into the working area of the electron beam perforation machine, that is, in its work chamber. It has however up to the present time not been possible to put perforation machines of the suggested type into practice. This can presumably be traced back to the fact that the attainable production quantities and production speeds were not sufficient in comparison with the very high expenditure necessary for the electron beam generator.

SUMMARY OF THE INVENTION

The object of the invention is therefore to provide a device of the type specified at the beginning for high production quantities and production speeds, which operates with representable expenditure, and is basically suitable for industrial use.

According to the invention this object is achieved with a device of the type previously specified which is characterised in that in a given working area within the work chamber a work-piece carrier placed there, which forms an element of a series of work-piece carriers lying in the transport track, can be moved in at least one working track lying outside the positions of the adjacent work-pieces in the series, relative to a beam source in such a way that the work-piece is thereby perforated at several specified places by means of the beam source.

With the device according to the invention there is consequently in the evacuated work chamber a complete series of work pieces to be worked (to be perforated), and each of the blanks to be worked is moved past the beam source without disturbing or moving the adjacent work-pieces in the series; thus, universal work can be carried out across relatively large surfaces with a fixed beam and without corresponding co-movement of adjacent workpiece carriers or work-pieces. The fact that the electron beam can be fixed, makes omission of beam deflection appliances possible and together with this a considerable simplification of the beam generator. Since during working, the series of work-pieces or work-piece carriers found in the work chamber does not need to be moved. Although a close succession of work-piece carriers can be present in the work chamber, the result is good utilisation of the volume of the work chamber. The speed of work now depends essentially only on the performance ability of the beam source, since the change between two work pieces to be worked takes place within the series of work pieces within the work chamber, it therefore can be carried out without operating the air locks; such an operation of air locks can be used for charging and removing in each case a complete quantity of work-piece carriers. Movement of the work-piece carrier with the blanks to be worked occurring without disturbing the adjacent work-piece carriers is preferably carried out above or below the series of work-pieces. The work track can have components which run normal to the transport direction, so that the space required in the work chamber by the width of the transport track can be used fully for the work track. Furthermore, it can be especially advantageous, if the work track runs on an angular surface opposite the transport track. The position of the working electron beam does not therefore need to depend on the position in which the work-pieces on the transport track are being moved, and in this way it is especially possible to work flat work-pieces such as in particular foil blanks, which for reasons of expediency are conveyed in approximately the horizontal position, from a generator placed horizontally after swivelling a horizontally running electron beam by 90°. A horizontal generator requires not only a small total height, but offers also advantages during handling and makes better use of space available.

In a further refinement of the invention it is particularly advantageous, if the work-pieces on the work-piece carriers are placed on the surface of revolution and the work track runs in the surface of revolution. In this way a considerably larger work-piece surface can be conveyed on a given length of the transport track; placing them in the surface of revolution nevertheless makes it possible to carry out movement in the work track with simple mechanical means. Better filling of space with the work-piece material to be worked is especially important for the component parts to be evacuated, i.e. in particular the actual work chamber, but also for the antechambers provided in the lock appliances.

Placing the work-pieces on surfaces of revolution can be done in a very simple way, by the fact that the work-piece carriers each have a circular cylindrical bearing area for the work-pieces and are controlled in the work area so that they can turn around their cylindrical axis. It is directly evident that this design with an especially simple mechanism is sufficient for the movements to be carried out. The carriers with the circular cylindrical bearing areas furthermore offer the advantage that they are available for further movement on rollers; accordingly, the work-piece carriers have circular cylindrical rolling surfaces coaxial to the bearing areas, on which they can be rolled along the transport track. Through this, a further considerable simplification is then possible wherein the transport track tends at least partly in the transport direction towards the horizontal, so that the work-piece carriers can then be driven by the force of gravity. In order to be able to use an electron beam which in this case is essentially horizontal, a carrier turning appliance can be provided in a further refinement of the invention in the work chamber, through which the carrier with the work-piece to be worked before the perforation process, can be moved from its transport position with an essentially horizontal cylinder axis to a position with an axis position essentially normal for the transport direction and after the perforation process can be moved back on the transport track with an essentially horizontal cylinder axis.

In order to be able to carry out the work movement automatically, the work-piece carriers are provided with a positioning fastener for the work-pieces, and furthermore with position markings, which work together with position feelers and position appliances operating in the work area, in order to provide the carrier there with a required exit position for movement in the work track.

For reaching a high perforation attainment with a simple and inexpensive construction it is also convenient if in a further refinement of the invention a beam source is provided for producing a band beam, of which the band width extends over the whole width of the area to be perforated on the blanks. It goes without saying that in a way known per se a beam splitter in the form of a template-type auxiliary tool is provided, which splits the band beam into a number of individual beams for every perforation bore. It is recognised, that with the device according to the invention the use of a beam with a beam splitter leads to the considerable simplification, namely that the work-piece to be perforated can only be guided past the band beam in one direction, and that with this, the band beam needs to be only pulsated, but not deflected. If only certain areas of the work-pieces are to be perforated with a simple beam source of this type, it is advantageous if detachable templates are joined to the work-piece carriers in a way known per se; these templates protect the work-piece placed on the carriers in specified areas against the perforating beams. Templates such as these can be used in a further refinement of the invention for simplifying transfer of the work-pieces on to the work-piece carriers; this is especially important for cases where work-pieces are blanks made of a flexible material, which are to be fixed not flat but on a surface of revolution or a cylindrical surface of the carrier. According to the invention the simplification aimed for is attained by the fact that the templates and the carriers have fasteners which can be geared together, and which fix the templates in specified positions on the carriers, and that the templates for their part have orientating support means for the work-pieces, and can be lined up with the work-pieces separate from the carriers. Since the templates are also curved corresponding to the rotation or cylinder surface, but lie on the work-piece carriers above the work-piece, the work-pieces must be laid on the inside, curved concavely, of the templates; this is considerably easier to do, especially with flexible work-pieces, than to lay them on a convexly curved surface. Lining up of the templates separate from the work-piece carriers offers the advantage which is significant for the object of the invention, that possible difficulties and irregularities which occur when soft foil blanks are positioned by hand, do not affect the continued transport and working of the work-piece carriers lined up with the templates and blanks. Preferably, the templates are moved separate from the work-piece carriers on template carriers along a lining-up track through a lining up station, where work-pieces can be fixed to the templates.

Frequently, full use of the plant is most possible if work-piece carriers, with correspondingly large dimensions can each take several templates with work-pieces. It is particularly advantageous if there is a device with which a pair of templates can be fixed to each of the work-piece carriers. It is useful if a pair of templates of this type are formed from two trough-shaped receptacles, which are joined together at one of their edges running axially, so that they can be turned. For fixing to the work-piece carrier the two receptacles are simply folded on to the cylinder surface of the carrier, and for lining up the pair of templates with work-pieces the two receptacles can be unfolded, so that the work-pieces, especially foil blanks can be comfortably fitted. Correspondingly it is useful for the device, if the template carriers are each set in the unfolded position to take a pair of templates such as this. The specified arrangement with a pair of work-pieces per work-piece carrier is not only mechanically advantageous, but also offers in the case of perforating blanks for shoe upper parts the special advantage that the blanks belonging to a pair of shoes are each on a carrier.

After the work-pieces are fixed on the templates, there still remains the task of fixing the templates to the work-piece carriers. Since the templates have relatively rigid forms and normally consist of metal sheets, this next step can be carried out without difficulty by machine. Accordingly, in a further refinement of the invention a delivery station is provided, in which the templates lined-up with the work-pieces can be taken from the template carriers by machine and put on to work-piece carriers. Controlling is carried out by the fact that the template carriers have mobile control members, which come into operation in the delivery station when a relative position of a template carrier and a work-piece carrier suitable for delivery is reached and during the delivery process operate the fastenings.

BRIEF DESCRIPTION OF THE DRAWINGS

The invention will now be further described, by way of example, with reference to the accompanying drawings, in which:

FIG. 1 is a greatly simplified plan view of a device according to the invention in which work-pieces in the form of blanks are transported flat and horizontal;

FIG. 2 is a schematic partial side view in the direction of the arrow II of FIG. 1;

FIG. 3 is a greatly simplified schematic partial side view approximately in the same direction as FIG. 2 of another embodiment, with which a cylindrical work-piece carrier is used;

FIG. 4 is a greatly schematised plan view of a device, which operates according to the system of FIG. 3, where a part of the upper wall of the work chamber is broken away;

DESCRIPTION OF PREFERRED EMBODIMENTS

Figure 5:
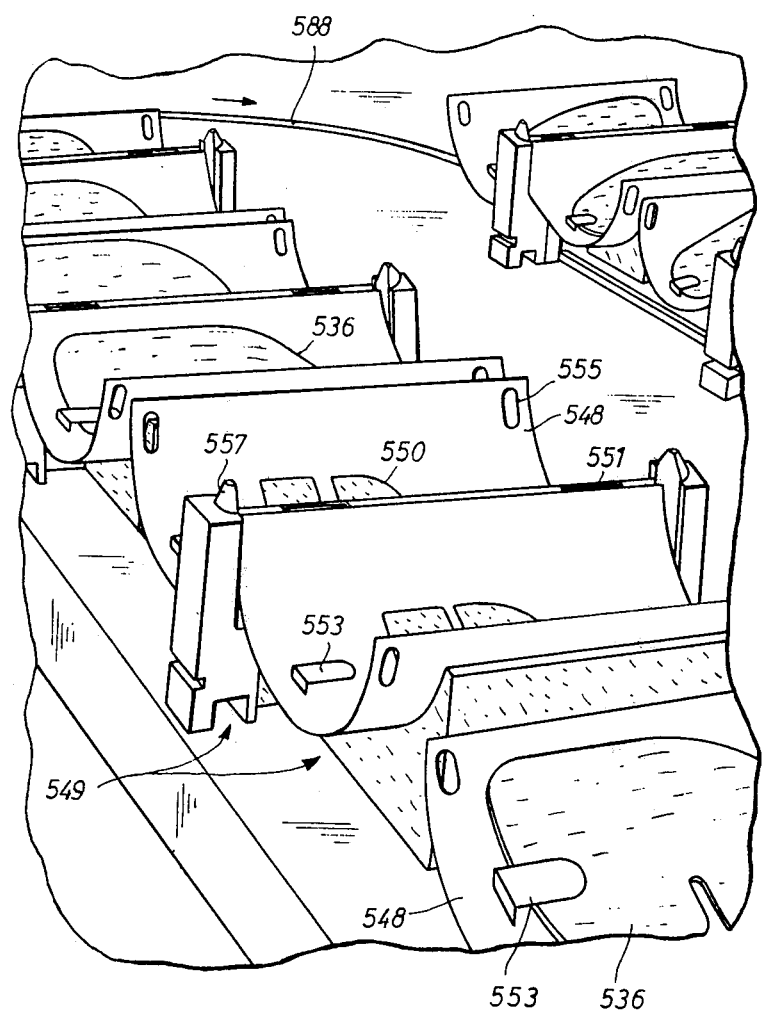
FIG. 5 is a schematic perspective partial view of a lining-up station for laying work-pieces into approximately semi-cylindrical templates.

FIG. 1 shows in a completely schematic plan view a device according to the invention with an electron beam work chamber 2, which can be evacuated with pumps 4 and 5 to the required vacuum of about $10^{-3}$ 1 mm Hg pressure. The work chamber 2 is accessible on two sides opposite each other across air locks. These locks consist, in a way already known, of an antechamber 6 or a follow-up chamber 8 with relevant pumps 10 or 12 and vacuum-tight pushers 14 and 16 or 18 and 20, which can be operated across controllable motors 22 and 24 or 26 and 28. Input and output appliances 30 are provided outside the work chamber 2; these contain an input and an output station 32 for the input (arrow 34) of unperforated blanks 36 and the output (arrow 38) of perforated blanks 40. Between the input and output appliances 30 and the work chamber 2, a transport track 42 extends across the air locks formed from the pushers 14, 16, 18 20 and ante- and follow-up chambers 6 and 8, this transport track is for the controlled transport of work-piece carriers 44, to which the unperforated blanks 36 forming the workpieces can be positioned. With the device shown in FIGS. 1 and 2 the unperforated blanks 36 are laid flat on to level surfaces of the work-piece carrier 44, where positioners and fasteners (not shown) can be provided. In the embodiment shown the blanks are not placed directly onto the work-piece carriers 44 but first fixed to templates 48 in predetermined positions in a lining-up station 46 which forms a part of the input and output station 32. For this purpose the templates can be provided with orientating support means (not shown) for the blanks. The tank of the templates is to protect the work-piece carriers in specified areas against the perforating beams; in FIG. 1 it is shown that the templates 48 have an elongated rounded off opening 50, which fixes the perforation area. The unit 52 consisting of the template 48 and the unperforated blank 36 fixed to this is passed into a delivery station 54, in which it is placed on to a work-piece carrier 44 by machine. With the appliance shown in FIG. 1 a delivery transport band 58 is provided circulating over guide rollers 55, 56 which runs in a delivery area 60 over the transport track serves for this purpose. In FIG. 1 a work-piece carrier 44 which is not yet lined up is shown in this delivery area 60, which carrier is to be lined-up with a unit of a template and a blank approaching from the left. With the embodiment shown delivery can simply take place with the aid of the force of gravity; the additionally necessary and controllable support appliances on the delivery transport band 58 are not shown, likewise the fasteners provided on the templates and carriers, which can be linked together, in order to fix the templates in predetermined positions to the carriers 44.

The work-piece carriers 44 lined-up with the templates and blanks move on the transport track 42 as in FIG. 1 from left to right through the antechamber 6 into the work chamber 2. The drive of the carriers 44 can either be effected by machine, for example with a chain and controllable cams fitted to it, or by the effect of their weight for which the transport track is positioned correspondingly inclined in it section going through the work chamber 2. An inclination of this type is assumed in FIG. 1. For synchronising further movement of the carrier 44 with the work processes and the input and output processes controllable pause devices are provided on the transport track 42, which consist in the simplest case of an electromagnetically controlled pause pin, which projects in the switched on position into the transport track 42. For the automatic synchronisation and control of the plant these pause devices 62 just like the other controllable elements of the device (especially the motors 22, 24, 25 and 28) are connected to a central control apparatus 64.

As can be seen clearly in FIG. 1, there is in the position shown of the device a series of workpiece carriers within the work chamber. In the middle of the work chamber is the work area. There, the work-piece carrier is held at a point which is fixed by the pause device 62a, and the additional work-piece carrier 44b in the series adjacent on the left is held by a further pause device 62b at a small distance from the carrier 44a. In order to enable the work-piece carrier to move forward systematically, more pause devices are necessary, which are not shown in the drawings. The carrier 44a found in the work area is held by a carrier movement device 66 and lifted so far that it can be moved relative to a fixed electron beam 68 in a work track, in which all required points of the blank can be perforated with the electron beam 68, without the neighbouring static work-piece carriers, in particular the work-piece carrier 44b, being in the way. As can be seen in FIG. 2, the electron beam runs vertically, so that it is shown only as a dot in FIG. 1. The carrier movement device 66 can, as shown in FIGS. 1 and 2, have in particular two withdrawable and extendable locking pins 70 which hold the carrier 44a to be worked in each case; the locking pins are located in a base 72, which can be moved along a vertical rail 74 on a sliding carriage 76, which for its part can be moved along a horizontal rail 78. The corresponding drive motors are not shown. It is recognised that with the help of the carrier movement devices 66 shown each of the carriers to be worked can be moved both up and down and also in the direction of the transport track (rail 78) and in a direction crosswise of the transport track 42 (pins 70). Optional movements can therefore be made in a plane lying above the transport track 42, even with components normal for the transport direction. It goes without saying that the electron beam 68 is pulsated for perforation.

In FIG. 2 it can be seen that the electron beam 68 is delivered from a beam source lying above the transport track 42, which is separated from the work chamber 2 by a wall 80 (with exception of a beam opening 82) and evacuated over its own pump openings 84.

After completion of the perforation process the carrier in question is again placed on the transport track 42, the pause device 62a is released, and the carrier moves in the direction towards the right-hand end of the work chamber 2. From time to time the carriers collected there are removed across the follow-up chamber. They then arrive back at the left end of the transport track in front of the delivery area 60, across an outer part of the transport track 42, which is shown in FIG. 1 only as a line with direction arrows. During this return transport, the templates with the perforated blanks attached are separated from the carriers at a separating station; the templates are transferred back to the input and output station 32 across a lining-up station 88, where the perforated blanks 40 are released from the templates 48 in a receiving head end. The templates then run further to the lining-up station 46 for renewed lining-up.

FIG. 3 illustrates, in a schematic representation similar to FIG. 2, another design, in which the blanks are positioned on the work-piece carriers on a surface of revolution, and the work track runs on the surface of revolution. For this purpose, essentially cylindrical work piece carriers 344 are used, which in each case have a circular cylindrical bearing surface 345 for the blanks 336 or blank-template combinations, of which the axial end areas form circular cylindrical roller bed areas for a transport track inclined against the horizontal. Through end flanges 347 the carriers are held on the transport track 342. Since the work-piece carriers roll further automatically under the influence of gravity, stopping devices 362 are provided, similar to FIG. 1, which again are electromagnetically controllable. Similar to the design in FIG. 1 a complete series of carriers 344 are taken up in the work chamber 302. The stopping device stops a work-piece carrier exactly in the work area. The carrier is then seized by a carrier turning device 349 and turned into the position shown with a vertical cylinder axis. In this vertical position the carrier 344 is lying in the correct position for the perforation work by means of an electron band beam 268, which enters the work chamber 302 across a corresponding slit-like screening opening. The band width of the beam goes across the total width of the area to be perforated, so that an axial movement of the carrier 344 is not necessary. The band beam 368 is delivered from a beam source with an essentially horizontal course of beam. In the working position illustrated with a vertical cylinder axis the cylindrical carrier is turned. For this purpose, either the turning appliance 349 itself can be fitted with a corresponding driving appliance or a driving wheel 359 is fed with the cylindrical carrier into driving contact by a separate drive 351. In the one end flange 347 of every carrier there is a position marking 353, illustrated here by a notch which works in conjunction with a position feeler 355 acting in the work area. The drive 351 turns the cylindrical carrier 344, until the position marking 353 is reported by the position feeler. After this the electron beam is switched on and pulsated, while the cylindrical carrier 344 is turned further. In order to divide the band beam into individual beams, a cooled beam splitter 357 is provided. It goes without saying that positioning fasteners are provided for the blanks on the carriers 344, so that the blanks have a definite position relative to the position marking 353. After the position feeler 355 again reports reaching of the position marking 353 and with this indicates completion of a revolution of the carrier 344, the drive wheel 359 is withdrawn, and the turning appliances turn the carrier back on to the transport track 342 and are released from the carrier 344. The stopping device is released, and the carrier rolls further to the right. Already before this, the adjacent carrier 344b on the left has run further into the waiting position fixed by the stopping device, by means of the release of the stopping device, and the next adjacent carrier 344c on the left has run further to the stopping device 362d. As soon as the stopping device 362a has been brought to the locking position after continued running of the carrier which has just been treated, the stopping device 362c is released, and the next carrier 344b runs into the work position. During working the stopping devices 362b and 362c are again brought into the locking position and the stopping device 362d is released. The next carrier 344c then runs as far as the stopping device 362b. The stopping device 362d is again brought to the locking position so that the carrier 344c runs into the waiting position fixed by the stopping device 362c and the next carrier 344d runs as far as the stopping position 362d. Naturally, all these processes occur automatically; obtaining the corresponding controls offers the specialist no difficulties.

The carrier 344 found in the work area in FIG. 3 is shown partly cut away, in order to show the beam splitter 357 and the band beam 368. Furthermore, a template 348 is shown, and through the template opening 350 of this the underlying blank 336 can be seen.

The distance between the carriers in the waiting position left of the stopping device 362c and the work position will preferably be smaller than in FIG. 3, where a larger distance was chosen for purposes of clarity.

FIG. 4 shows a schematic partly broken away plan view of a device with the procedure according to FIG. 3. Illustrated are the work chamber 402, the antechamber 406, the follow-up chamber 408, the vacuum pushers 416 and 418, and also vacuum pumps 404, 405, 410 and 412 with the corresponding supply lines. Through the upper wall of the work chamber 402 which has been cut open, the transport track 442 consisting of two rails can be seen, a carrier 444b in the waiting position, stopping devices 462c and 462a. Also, the carrier 444 with a vertical axis in the working position can be seen. A beam generator 481 with a horizontal course of beam is used. The beam is discharged from the beam generator 481, which is held at a high vacuum with diffusion pumps 483 and 485, guided into an intermediate chamber 487, which is connected to its own pumps 489 and 491 and from there arrives in the work chamber 402. The beam generator can be conveyed together with its pumps on a base 493 on rails; this simplifies servicing.

FIG. 5 illustrates in a schematic perspective representation a cutout from the line-up station of a design, in which the templates 548 can be moved separate from the work-piece carriers, on template carriers 549 along a lining-up track 588 through a lining-up station, which have to be imagined in the foreground of the picture. The templates 548 are intended for cylindrical work-piece carriers, and to each work-piece carrier a pair of templates can be fixed, and accordingly the templates 548 form a trough-shaped receptacle, and in each case two templates belonging to one pair are joined together each at an axial longitudinal edge by means of hinges 551, so that they can be turned. The template carriers 549 are in each case set in the open position for picking up a pair of templates, so that the blanks to be perforated can be deposited comfortably. For mounting and directing the blanks orientating support means 553 are provided on the template insides in the form of clips, under which the blanks are inserted so that they hold. In the templates 548 template openings 550 are provided, which determine the area to be perforated. Moreover, every template is to be provided at its free corners with fasteners 555 in the form of holes. These holes are brought into engagement on the carriers with the relevant fasteners. In FIG. 5 templates both empty and also lined-up with blanks 536 are shown in the foreground. The template carriers 549 are provided with movable control members 557 in the form of telescopic pins, which when assembled with the carrier are operable in order to fix the templates to the carrier.

Figure 6:
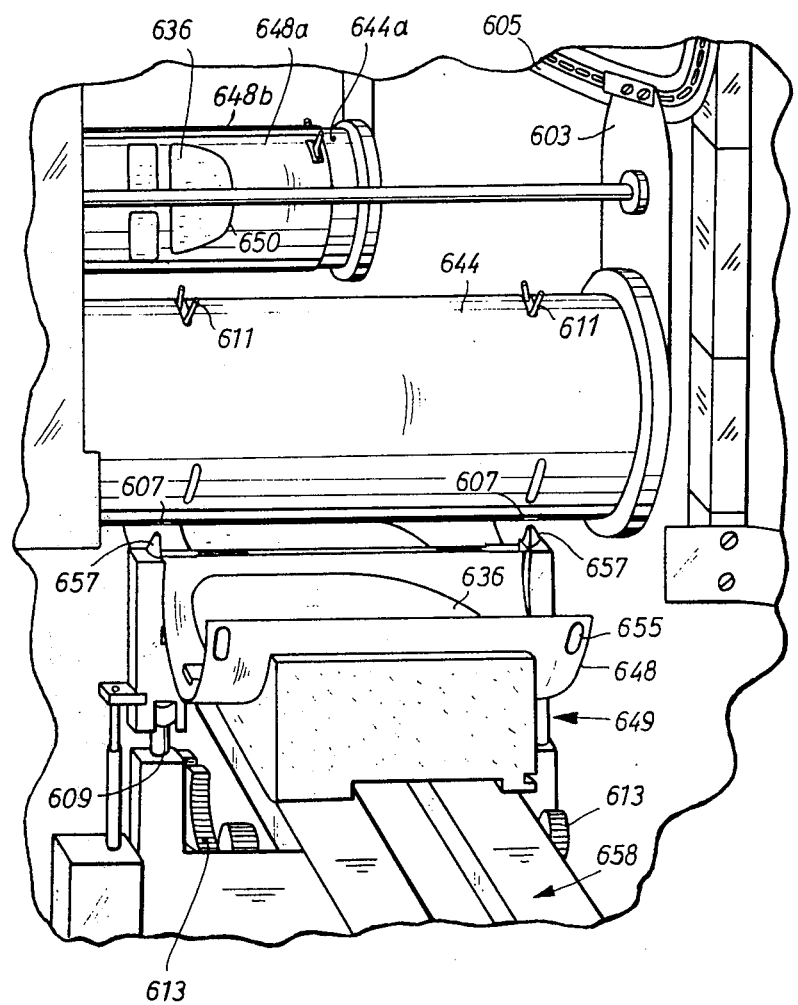
FIG. 6 is a schematic perspective partial view of a delivery station in which templates lined-up according to FIG. 5 are delivered onto cylindrical work-piece carriers.

FIG. 6 illustrates in a schematic perspective partial representation several essential parts of a delivery station, in which templates of the type illustrated in FIG. 5 can be applied to cylindrical work-piece carriers 644 by machine. A template carrier 649 coming from the lining-up station reaches on a delivery transport track 658 a predetermined delivery position, which can be of an electromagnetically controllable stopping device. This delivery position lies below a carrier delivery position. The cylindrical carriers 644 are seized on this part of their transport track by gripping arms 603, which can be moved further in a groove 605 in a predetermined track. When the illustrated carrier delivery position is reached the carrier 644 is stopped and by means of a motor (not shown) turned to a position in which control openings 607 lie opposite the pin-like control members 657 of the underlying template carrier 649. The control members 657 are guided into the control openings 607 with rams 609. Fixing pins 611 which project from the cylinder surface 644 and feather in a circumferential direction are drawn back inside the cylinder. Simultaneously, the two templates 648 carried by the template carrier 649 are lifted by means of a lifting and turning appliance 613, and folded around the cylinder surface of the carrier 644. The ram 609 is retracted, so that the pins 611 again come out of their openings and engage in the holes 655 of the templates 648. After complete lowering of the rams 609 the pins are again to feather freely in a circumferential direction, and thereby to draw the templates 648 around the circumference of the carrier 644. An exact predetermined position of the templates 648 and the blanks 636 found there on the carrier 644 is then assured. In the background of FIG. 6 a carrier 644a can be seen with templates 648a and 648b ready positioned. There can also be seen the template openings 650 and the exposed parts of the blanks 636.

The device described makes it possible in particular technical mass production of electron beam perforated artificial leather with an acceptable expenditure. A good perforation quality can be maintained up to very high work speeds, whereby the pulsated beam is purposely deflected during the duration of the pulse corresponding to the movement speed of the blank, and the pulse intervals are allowed to rebound. This simple pulling-in of the beam requires no great additional expenditure, in contrast with the procedures in which the entire perforation pattern is produced by deflection of the beam.

In practice, a device of the type described makes possible a work speed of 200 top part-pairs per hour over a shift time of 8 hours, for the perforation of heat impressed shoe upper parts, that is the perforation of 1600 top part-pairs per shift.

The decomposition products occurring during perforation are partly pumped out gaseously and partly with catching devices. Such catching devices are known in various forms, for example, in the form of a wind and unwind foil, which is positioned by the beam point of impact nearly in front of the foil and penetrated by the beam. Description of this and other known accessories is omitted here; it goes without saying that such accessories can be readily applied with the device according to need.

Figure 7:
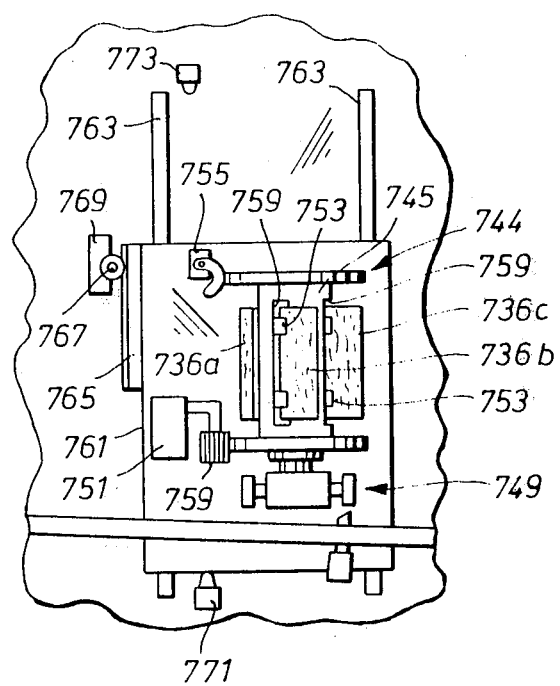
FIG. 7 is a schematic view of another embodiment in a representation corresponding to the right-hand part of FIG. 2.

FIG. 7 shows in a view corresponding to the right-hand part of FIG. 3 a cylindrical work-piece carrier 744 found in the work area and in the work position, of an altered design, in which the fasteners or supporting means 753 for the work-pieces 736a, 736b and 736c can be moved. Such movable supporting means allow the work-pieces 736a, b, c to be moved on the carrier 744. This is for example advantageous or necessary when essentially rigid work-pieces come into question, which have curvatures in the area to be perforated different from the cylindrical surface of the carrier 744. Such curved work-pieces 736a, b, c, are shown in FIG. 7; this can in particular relate to turbine blades which are to be perforated. The fasteners 753 are formed as clamps, which are positioned in the interior of the carrier 744 underneath moving carriages 759 on the turning axis not illustrated. These turning axes can be turned by a drive which is not illustrated, which is also positioned in the interior of the carrier 744. The curved work-pieces 736 are guided with their one edge through the slit 759 into the fastener (clamp) 753; and clamped in it; this process can also run automatically in a charging station. In the work shown in FIG. 7 the carrier has been turned into the work position shown by means of turning appliances 749, which correspond to the turning appliances 349 of the embodiment according to FIG. 3. During this, a drive wheel 759 of a drive 751 engages with the carrier 744, similar to embodiment according to FIG. 3 so that this can be turned. Control is carried out similar to the design in FIG. 3 across a position feeler 755. As soon as the illustrated work position is reached, the drive 751 is switched on, and the carrier 744 is turned. When the position feeler 755 reports reaching of a definite initial turning position of the carrier 744, the beam generator is turned on, and the work-piece which is then lying correctly (in FIG. 7 the work-piece, not visible, lying on the side of the carrier 744 turned away from the drawing plane) is perforated. The drive, not illustrated in the inside of the carrier 744 can thereby in synchronism with the turning of the carrier 744 turn the turning axis, not illustrated on which the fasteners 753 are fixed, and thereby turn the work-pieces on the carrier 744. In FIG. 7 three curved work-pieces 736b and 736c can be seen, of which 736a and 736b are moved as near as possible to the circular cylindrical surface 745 of the carrier 744, while the work-piece 736c is placed in a position turned away from this surface 745. This type of turning of work-pieces can be advantageous or necessary, in order to allow an approaching electron beam approaching in an essentially fixed direction to strike the work-piece at a required angle, in particular a right angle, or to give this striking angle different sizes in various areas of the work-piece. The drive of the fasteners (clamps) 753 can also be controlled by the position feeler 755, so that it works in synchronism with the turning movement of the carrier 744. The energy supply to the drive not shown in the interior of the carrier takes place in the simplest case across touch contacts (not illustrated). Instead of this inner drive the required movement of the work-pieces on the carrier can be effected mechanically, for example through a control finger (not shown) placed in the carrier and projecting into its interior, which finger works in conjunction with a control profile moved against the carrier or fixed (not shown). These and other measures working in a similar way can easily be taken by specialists in drive and controlling techniques. It goes without saying that other types of work-piece movement on the work-piece carriers, especially multidimensional movements, can be achieved easily; the specialist will have no difficulty in obtaining the corresponding device for each individual case, in order to reach the required movements and to synchronise these with the other work processes.

FIG. 7 shows yet another embodiment which allows movement of the work-pieces relative to the beam to be formed so that they are still more universal. For this purpose, the turning appliance 749, the drive 751 and the position feeler 755 are placed on a movable carriage which can be moved on rails 763 in the vertical direction. The drive is effected across a toothed rack 765 which is firmly fixed to the movable carriage 761 and working in conjunction with it a pinion 767 of a movable carriage drive 769. For limiting the vertical movement limit end switches 771 and 773 are provided, the position of which can also be adjusted. It can readily be seen, that through the vertical movement of the movable carriage shifting of the work area on the work-pieces is possible in the direction of the movable carriage movement. With this a perforation pattern can be produced, for example with the use of the vertical beam splitter described further on; the hole distances of this perforation pattern are also smaller in the vertical direction (generally in the direction of the division of the beam splitter).

Combinations of movement of the work-piece and of the beam are also possible, and during the vertical movement described of the work-piece on the movable carriage 761 a working beam in the vertical direction can for example be followed up, if this should be necessary, in order to obtain clean and/or straight perforation holes.

It is recognised that the possibility of a translation movement in the vertical described in FIG. 7 can also be replaced or completed through other movements, whereby a combination of the turning movement of an essentially circular cylindrical work-piece carrier 744 with several translation movements, especially two running vertically to each other, can be advantageous, if there are complicated work conditions. In every case it is easily possible with the known means of the appropriate technique, to synchronise the translation movements for example the vertical movement described in FIG. 7, with the rest of the movements of the work-piece carrier.

What is claimed is:
1. A device for perforating foil blank work pieces with an electron beam comprising:
   an electron beam source;
   an evacuatable electron beam work chamber coupled to said electron beam source for receiving the electron beam in a work area;
   input and output gating means for said work chamber providing entrance and exit of the work pieces to and from the chamber, said gating means including air locks for maintaining the evacuation of said chamber;
   a transport appliance having a transport track extending through the work area of said chamber at a location removed from said electron beam, across said air locks and between said input and output gating means;
   a plurality of work piece carriers for receiving the work pieces in a predetermined position, said work piece carriers being adapted to be serially transported on said track and to be detachable therefrom; and
   transport control means for displacing the work piece carriers from said track at said work area for placing said work pieces in said electron beam for perforating the work pieces.

2. A device as claimed in claim 1 wherein said transport control means is further defined as including a second transport appliance located in said work chamber for removing said work piece carriers from said transport track for moving said carriers through a predetermined work path in said work area displaced from said transport track and along which said work pieces intersect said electron beam and for returning said carriers to said transport track.

3. A device as claimed in claim 2 wherein said second transport appliance includes a work track displaced from said transport track and forming at least a portion of said predetermined work path.

4. A device as claimed in claim 3 in which said work track runs parallel to said transport track.

5. A device as claimed in claim 3 in which said work track has components which run normal to the transport track.

6. A device as claimed in claim 1 in which said work piece carriers contain a surface of revolution for receiving said work pieces.

7. A device as claimed in claim 6 in which said work piece carriers each have a cylindrical area for receiving said work pieces and said transport control means includes means for controllably rotating the carriers in said work area about the axis of said cylindrical area.

8. A device as claimed in claim 7 in which said work piece carriers further include cylindrical roller areas coaxial to said areas receiving said work pieces and on which the carriers are rollable along said transport track.

9. A device as claimed in claim 8 in which said transport track is inclined at least partly in said direction of transport of said carriers along said track so that horizontal work piece carriers are rollable by the force of gravity along said track.

10. A device as claimed in claim 9 in which said second transport appliance includes a carrier pivoting means by which a carrier together with a work piece is movable from its transport position in which the cylindrical axis is substantially horizontal to a work position in which the axis is substantially normal to the transport direction.

11. A device as claimed in claim 10 in which said beam source is arranged to produce a beam with an essentially horizontal direction.

12. A device as claimed in claim 7 in which said work piece carriers have positioning markers for identifying the position of the work pieces on the carriers, and said transport control means includes detection means responsive to said positioning markers for establishing the starting position of the carriers for placement in said electron beam.

13. A device as claimed in claim 12 in which said work piece carriers have fasteners for said work pieces and said fasteners are movable by a drive which is adapted to be synchronized in the work area with the movement of said work piece carrier.

14. A device as claimed in claim 7 in which said transport control means carry out a translational movement of said work piece carriers in said work area in addition to their rotation.

15. A device as claimed in claim 14 wherein said transport control means further includes a movable carriage for carrying out the translational movement, and a carriage drive synchronizable with the other movements of said work piece carrier.

16. A device as claimed in claim 1 wherein said beam source produces a band like beam, the width of which extends across the area to be worked on said work pieces.

17. A device as claimed in claim 1 including templates for receiving the work pieces to shield given areas of the work pieces against said beam, said templates and carriers having fastener means which are engageable with each other to detachably fix said templates to said carriers.

18. A device as claimed in claim 17 wherein said templates have orienting support means for said work pieces and being adapted to receive said work pieces separately from said carriers.

19. A device as claimed in claim 17 in which each of said work piece carriers is adapted to carry a plurality of templates.

20. A device as claimed in claim 19 in which a pair of templates is affixable to each of said work piece carriers.

21. A device as claimed in claim 20 in which said pair of templates is formed from two trough shaped receptacles, which are pivotally connected along edges extending axially of said trough shaped receptacle.

22. A device as claimed in claim 17 further including a loading track along which said templates are movable, said device further including a loading station along said loading track wherein said work pieces are affixable to said templates.

23. A device as claimed in claim 22 including template carriers movable along said track, said template carriers each have means for attaching a template thereon.

24. A device as claimed in claim 23 in which said template carriers are each adapted to carry a pair of templates.

25. A device as claimed in claim 23 and further including a transfer station having means for automatically transferring templates and work pieces from said template carriers to said work piece carriers.

26. A device as claimed in claim 25 in which said template carriers have movable control members adapted to be actuated in the transfer station upon attainment of a position of a template carrier and a work piece carrier suitable for transfer of the templates and work pieces.

27. A device as claimed in claim 1 and further including means for controllably moving said work pieces on said work piece carriers.

28. A device as claimed in claim 1 including means for producing coordinated movement of said work piece and said beam.

29. A device as claimed in claim 1 in which said electron beam source includes means for diverting the beam corresponding to the movement speed of said work piece.

30. A device as claimed in claim 29 including means for pulse controlling the beam and in which there is provided means for returning the beam during the pulse pauses.

* * * * *